US010989652B2

(12) United States Patent
Feng et al.

(10) Patent No.: US 10,989,652 B2
(45) Date of Patent: Apr. 27, 2021

(54) SYSTEMS AND METHODS FOR COMBINING OPTICAL METROLOGY WITH MASS METROLOGY

(71) Applicant: Lam Research Corporation, Fremont, CA (US)

(72) Inventors: Ye Feng, Portland, OR (US); Rajan Arora, Hillsboro, OR (US); Jason Shields, Pleasanton, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 743 days.

(21) Appl. No.: 15/696,768

(22) Filed: Sep. 6, 2017

(65) Prior Publication Data
US 2019/0072482 A1 Mar. 7, 2019

(51) Int. Cl.
*G01N 33/48* (2006.01)
*G01N 33/50* (2006.01)
(Continued)

(52) U.S. Cl.
CPC .............. *G01N 21/25* (2013.01); *G01B 11/06* (2013.01); *G06F 30/20* (2020.01); *G06N 20/00* (2019.01);
(Continued)

(58) Field of Classification Search
CPC .... G01N 21/25; G01N 2201/08; G06F 30/20; G01B 11/06; G01B 2210/56; G06N 20/00; G06N 7/005; G06N 20/10; G06N 20/20
See application file for complete search history.

(56) References Cited

U.S. PATENT DOCUMENTS 5,018,007 A * 5/1991 Lang ................. G02F 1/133524
348/742
6,284,986 B1 9/2001 Dietze et al.
(Continued)

FOREIGN PATENT DOCUMENTS

WO WO-9931483 A1 * 6/1999 ......... G01B 11/0625

OTHER PUBLICATIONS

M.Sendelback and C. Archie; "Scatterometry measurement precision and accuracy below 70nm", downloaded from: http://proceedings.spiedigitallibrary.org/pdfacess.shx?url=/data/conferences/spiep/7487/ on Feb. 20, 2017; 15 pages.
(Continued)

*Primary Examiner* — Russell S Negin

(57) ABSTRACT

A metrology system for substrate processing includes an optical metrology station including a plurality of optical sensors to measure spectra from a plurality of measurement locations on a substrate. A plurality of fiber cables are connected to the plurality of optical sensors. A spectrometer is selectively connected to the plurality of fiber cables. A mass metrology station measures at least one of a mass or mass change of the substrate. A controller includes a modelling module to generate thickness values at the plurality of measurement locations based on the spectra from the plurality of measurement locations and a learned model. A spatial modelling module generates a spatial thickness distribution model for the substrate based on the thickness values at the plurality of measurement locations from the modelling module and the at least one of the mass or the mass change from the mass metrology station.

29 Claims, 8 Drawing Sheets

(51) Int. Cl.
*G01N 21/25* (2006.01)
*G06N 20/00* (2019.01)
*G01B 11/06* (2006.01)
*G06F 30/20* (2020.01)

(52) U.S. Cl.
CPC ...... *G01B 2210/56* (2013.01); *G01N 2201/08* (2013.01)

(56) References Cited

U.S. PATENT DOCUMENTS

| | | |
|---|---|---|
| 6,694,284 B1 | 2/2004 | Nikoonahad et al. |
| 6,791,310 B2 | 9/2004 | Smith |
| 6,982,567 B2 | 1/2006 | Smith |
| 7,005,306 B1 * | 2/2006 | Poris ............... H01L 22/14 257/E21.53 |
| 9,228,886 B2 | 1/2016 | Wilby |
| 9,330,985 B2 | 5/2016 | Vaid et al. |
| 2003/0012544 A1 * | 1/2003 | Matsumoto ......... G02B 6/3676 385/137 |
| 2003/0071994 A1 | 4/2003 | Borden et al. |
| 2013/0203188 A1 | 8/2013 | Vaid et al. |
| 2016/0141193 A1 | 5/2016 | Pandev et al. |
| 2017/0028560 A1 | 2/2017 | Senn |

OTHER PUBLICATIONS

"Unsupervised Feature Learning and Deep Learning Tutorial"; "Autoencoders"; http://ufldl.stanford.edu/tutorial/unsupervised/Autoencoders/ taken from the web: Aug. 3, 2017; 5 pages.
Lindsay I. Smith; "A tutorial on Principal Components Analysis"; Feb. 26, 2002; downloaded from: http://www.cs.otago.ac.nz/cosc453/student_tutorials/principal_components.pdf; 27 pages.

* cited by examiner

SYSTEMS AND METHODS FOR COMBINING OPTICAL METROLOGY WITH MASS METROLOGY

FIELD

The present disclosure relates to substrate processing systems, and more particularly to systems and methods for combining optical and mass metrology.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Electronic devices are fabricated on substrates such as semiconductor wafers using a variety of processing techniques such as deposition, etching, cleaning and/or other treatments. Examples of deposition techniques include chemical vapor deposition (CVD), physical vapor deposition (PVD), atomic layer deposition (ALD), etc. Examples of removal or etching techniques include stripping, wet etching, dry etching, chemical mechanical polishing (CMP), etc.

These substrate treatments typically cause changes to a surface of the substrate and/or to the mass of the substrate. For example, deposition generally increases the mass of the substrate while etching generally decreases the mass of the substrate. During production, it is desirable to assess the substrates to determine whether processing is being performed correctly and/or to adjust the process prior to production of subsequent substrates.

Mass metrology systems have been developed to measure the mass or the change in mass of a substrate during processing. While mass metrology systems are fairly accurate, use of the mass data that is generated is somewhat limited. For example, a mass change during a process may occur due to multiple factors. Some causes of changes in mass are correlated changes. Some changes in mass are distributed across the substrate and may generate zero mass change. While some processes combine mass metrology systems with other metrology systems, the cost tends to be too high.

SUMMARY

A metrology system for substrate processing includes an optical metrology station including a plurality of optical sensors to measure spectra from a plurality of measurement locations on a substrate. A plurality of fiber cables are connected to the plurality of optical sensors. A spectrometer is selectively connected to the plurality of fiber cables. A mass metrology station measures at least one of a mass or mass change of the substrate. A controller includes a modelling module to generate thickness values at the plurality of measurement locations based on the spectra from the plurality of measurement locations and a learned model. A spatial modelling module generates a spatial thickness distribution model for the substrate based on the thickness values at the plurality of measurement locations from the modelling module and the at least one of the mass or the mass change from the mass metrology station.

In other features, a plurality of shutters is connected to the plurality of fiber cables, respectively. The plurality of shutters is configured to sequentially output spectra from one of the plurality of fiber cables at a time to the spectrometer. The learned model is generated using machine learning. The machine learning includes a supervised learning model selected from a group consisting of linear models, support vector machine models, decision tree models, random forest models and Gaussian models. The learned model is based on a first-principle model. The first-principle model is selected from a group consisting of Fresnel multi-beam interference, rigorous coupled-wave analysis (RCWA), and finite-difference time-domain (FDTD).

In other features, the substrate includes a plurality of dies. The optical sensors have a beam diameter that generates samples from portions of a plurality of contiguous dies. The learned model is generated by correlating the spectra from a plurality of measurement locations of a plurality of sample substrates with at least one of thickness data, critical dimension data, depth data and material density data generated by a standalone metrology station for the plurality of measurement locations for the plurality of sample substrates.

In other features, the learned model is generated by performing principal component analysis. The spatial modelling module uses the at least one of the mass or the mass change as at least one of a constraint or a boundary condition during regression analysis.

In other features, the learned model is generated using an autoencoder. An optical sensor positioner adjusts a position of at least one of the optical sensors. A substrate support positioner adjusts a position of the substrate support. The plurality of optical sensors measure spectra from opposing surfaces of the substrate.

In other features, the spatial modelling module generates the spatial thickness distribution model for the substrate further based a thickness of the substrate prior to film treatment.

A method for providing metrology for substrate processing includes providing an optical metrology station including a plurality of optical sensors to measure spectra from a plurality of measurement locations on a substrate; measuring at least one of a mass or mass change of the substrate; generating thickness values at the plurality of measurement locations of the substrate based on the spectra from the plurality of measurement locations and a learned model; and generating a spatial thickness distribution model for the substrate based on the thickness values at the plurality of measurement locations and the at least one of the mass or the mass change.

In other features, the learned model is generated using machine learning. The machine learning includes a supervised learning model selected from a group consisting of linear models, support vector machine models, decision tree models, random forest models and Gaussian models. The model is based on a first-principle model. The first-principle model is selected from a group consisting of Fresnel multi-beam interference, rigorous coupled-wave analysis (RCWA), and finite-difference time-domain (FDTD).

In other features, the substrate includes a plurality of dies. The optical sensors have a beam diameter sufficient to generate samples from portions of a plurality of contiguous dies.

In other features, the method includes generating the learned model by correlating the spectra from a plurality of measurement locations of a plurality of sample substrates with at least one of thickness data, critical dimension data, depth data and material density data generated by a standalone metrology station for the plurality of measurement locations for the plurality of sample substrates.

In other features, the method includes generating the model by performing principal component analysis. The method includes using the at least one of the mass or the mass change as at least one of a constraint or a boundary condition during regression analysis for the spatial thickness distribution model.

In other features, the method includes generating the learned model using autoencoding. The method includes adjusting a position of at least one of the optical sensors during measurement of the spectra for the substrate. The method includes adjusting a position of the substrate support during measurement of the spectra for the substrate. The method includes measuring spectra from opposing surfaces of the substrate.

In other features, the method includes generating a thickness of the substrate prior to film treatment and generating the spatial thickness distribution model for the substrate further based the thickness of the substrate prior to film treatment.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1A:
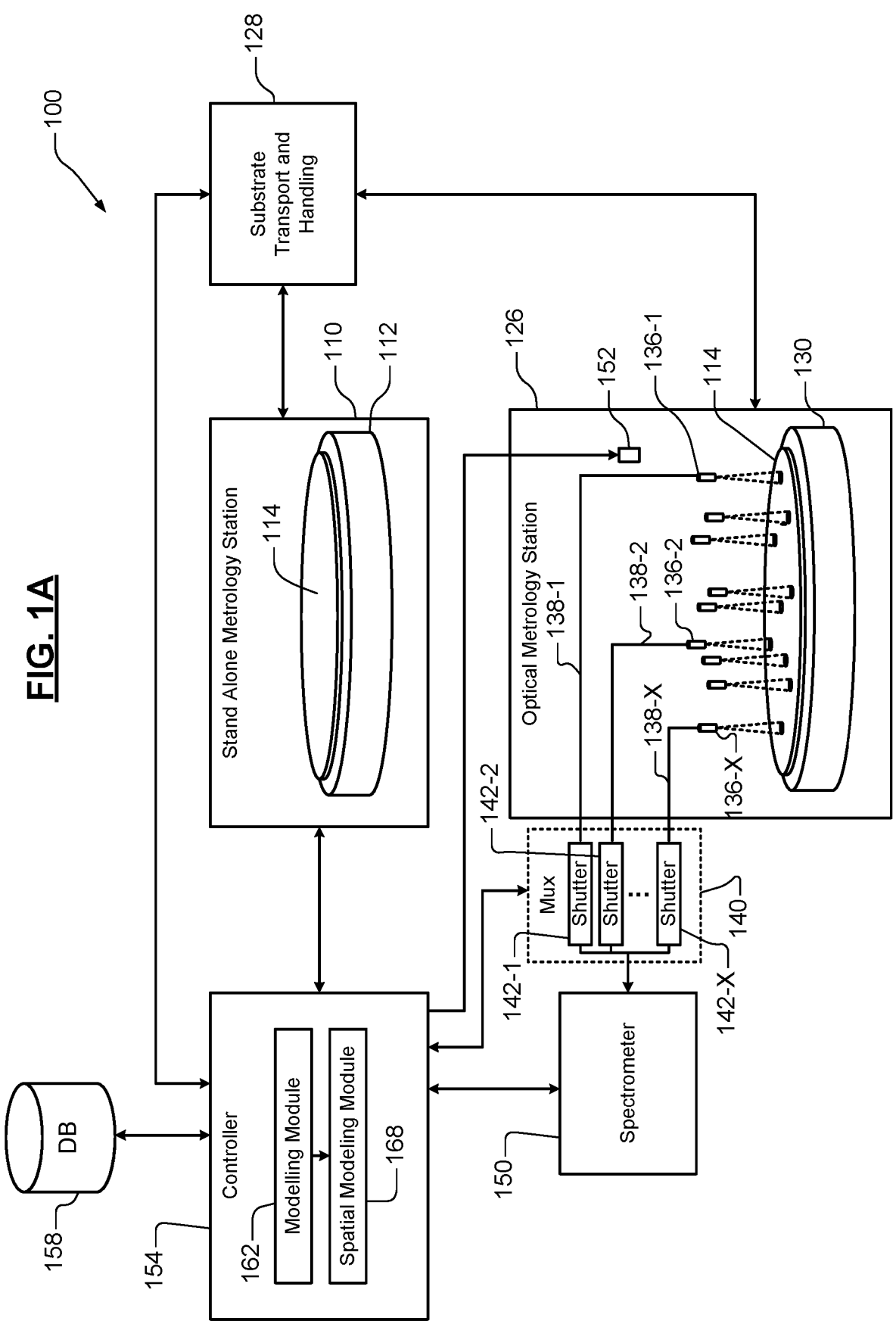
FIG. 1A is a functional block diagram of an example of a metrology system according to the present disclosure configured for model training.

Systems and methods according to the present disclosure relate to a metrology system that combines both optical metrology and mass metrology into a cost effective and accurate metrology system. As can be appreciated, the process that is to be monitored can be an additive process such as deposition, a subtractive process such as stripping or etching, or other treatment process such as cleaning.

During a training mode of a learned model and a subsequent production mode, the metrology system uses an optical metrology station including a plurality of optical sensors and a spectrometer. The spectrometer generates spectra at a plurality of measurement locations for each of a plurality of substrates. The spectra are stored along with substrate and location identifying data. The spectra are measured at multiple different wavelengths.

A high-cost, high-accuracy standalone metrology station having spatial resolution is also used to generate reference measurements for the plurality of substrates. The reference measurements are related to substrate parameters at the plurality of measurement locations for at least the same set of substrates. The substrate parameters measured by the standalone metrology station include at least one of thickness data, critical dimension data, depth data and/or material density data. Target reference values are based on the measurements generated by the standalone metrology station. The target reference values are stored with substrate and location identifying data.

Modeling is used to correlate the spectra and the target reference values and to generate a learned model. Subsequently, the learned model is used to convert the spectra for production substrates into physical substrate parameters (such as thickness at particular locations of the substrates) as will be described further below.

When ramping up to production volumes, the substrate processing systems and metrology systems are duplicated to scale production of the substrates. The relatively high cost of the standalone metrology system typically makes it too costly to use during production. According to the present disclosure, the standalone metrology system is replaced by a less-expensive mass metrology station and the expensive standalone metrology system is no longer needed, which reduces cost.

During production, the optical metrology system generates the spectra for the production substrates as described above. The spectra are fed to the learned model, which generates physical parameters such as thickness data or other substrate physical parameters for the plurality of measurement locations of the substrate. A mass metrology station is used to generate mass or mass change data for each of the substrates.

The thickness data for the measured locations is provided as inputs to a spatial thickness distribution module, which determines a surface model or curvature of the top surface of the substrate. The spatial model defines the thickness of the substrate or a layer thereof across the entire surface of the substrate. The mass or mass change is used by the spatial thickness distribution model as a constraint or boundary condition for regression analysis. In other words, the density of the layer added or removed is known and the mass change is also known. Therefore the mass or mass change is used to constrain the spatial model. The resulting spatial thickness distribution model of the substrate surface is used to determine the thickness of the top surface of the substrate at locations other than the measurement locations. The thickness can be used in conjunction with the mass or mass change to diagnose system performance and to make changes to process parameters for production of subsequent substrates.

Referring now to FIG. 1A, a metrology system 100 is shown during training. A substrate transport and handling system 128 may include one or more robots, transfer stations, and/or other devices for transporting and delivering the substrates to the metrology stations of the metrology system 100. In some examples, the substrates are accurately positioned by a system including a robot and a camera, although other methods can be used. For example, suitable systems for positioning the substrate are described in commonly-assigned U.S. Patent Publication No. 20170028560, which is published on Feb. 2, 2017 and is entitled "System and Method for Wafer Alignment and Centering with CCD Camera and Robot", and which is hereby incorporated by reference in its entirety.

The metrology system 100 includes a standalone metrology station 110 to generate target reference values that are used to generate the learned model. In some examples, the standalone metrology station 110 includes a substrate support 112. A substrate 114 is arranged on the substrate support 112 and physical measurements are made on the substrate 114. In some examples, the standalone metrology station 110 is a high-cost, high-accuracy metrology station such as an optical metrology station. The standalone metrology station 110 generates high accuracy metrology data. Target reference values, as will be described further below, are generated by the standalone metrology station 110 for at least the measurement locations used by the optical metrology station described below. In some examples, the target measurements made by the standalone metrology station 110 include at least one of thickness data, critical dimension data, depth data and/or material density data.

The metrology system 100 further includes an optical metrology station 126. The optical metrology station 126 includes a substrate support 130 supporting the substrate 114 during optical metrology measurements. The optical metrology station 126 generates optical spectra at the plurality of measurement locations on the substrate.

The optical metrology station 126 includes a plurality of optical sensors 136-1, 136-2, . . . , and 136-X (collectively optical sensors 136) for each of the plurality of measurement locations, where X is an integer greater than one. Each of the plurality of optical sensors 136-1, 136-2, . . . , and 136-X is connected by a fiber cable 138-1, 138-2, . . . , and 138-X (collectively fiber cables 138) to a spectrometer 150. A multiplexer 140 including a plurality of shutters 142-1, 142-2, . . . , and 142-X (collectively shutters 142) may be used to output a selected one of the fiber cables 138 to the spectrometer 150.

As will be described further below, the standalone metrology station 110 and/or the optical metrology station 126 may include one or more sensors 152 such as optical sensors, cameras, physical sensors, etc. to sense a position of the substrate relative to the substrate support and a control system for adjusting the position of the substrate as needed. For example, an x-y axis position of the substrate is determined in a plane parallel to an upper surface of the substrate support 112 and/or 130 and/or a rotational position of a notch of the substrate is determined relative to a desired rotational position.

During the learned model training mode, substrate measurements are made at multiple measurement locations on each of a plurality of substrates using both the optical metrology station 126 and the standalone metrology station 110. Metrology data including the spectra data and the target reference values (along with substrate identification and location data) are stored (for example in a database) for subsequent analysis.

The metrology system 100 further includes one or more controllers 154 (collectively controller 154) to control the process, substrate transport and handling of the metrology stations. The controller 154 communicates with the standalone metrology station 110, the optical metrology station 126, the substrate transport and handling system 128, the spectrometer 150 and/or the multiplexer 140 and coordinates delivery and positioning of the substrates and metrology measurements. The controller 154 receives metrology data from the standalone metrology station 110 and the optical metrology station 126. In some examples, the metrology data is stored in a database 158.

The controller 154 may further include a modelling module 162. In some examples, the modelling module 162 creates a learned model using machine learning based on the spectra and the target reference values. In some examples, the machine learning includes a supervised learning model selected from a group consisting of linear models, support vector machine models, decision tree models, random forest models and Gaussian models. Examples of machine learning include principal component analysis (PCA), a neural network, autoencoders, regression, and/or partial least squares (PLS). Autoencoders are described in an article titled "Unsupervised Feature Learning and Deep Learning Tutorial", which is made available on the internet by Stanford University, and which is hereby incorporated by reference in its entirety. In other examples, the modelling module 162 uses a first-principle model such as Fresnel multi-beam interference, rigorous coupled-wave analysis (RCWA), or finite-difference time-domain (FDTD).

The learned model correlates the spectra generated by the optical metrology station 126 with the target reference values generated by the standalone metrology station 110. Subsequently the learned model can generate thickness values during production directly based on the spectra without the need to generate target reference values. Once the learned model is generated during the training mode, the standalone metrology station 110 is no longer needed, which reduces the cost of the metrology system as will be described further below.

A spatial modeling module 168 generates a spatial thickness distribution model for the substrate based on the thicknesses at the measurement locations generated by the learned model. The mass metrology data generated by the mass metrology station described further below is used as a constraint or boundary condition for regression analysis when generating the spatial model.

Figure 1B:
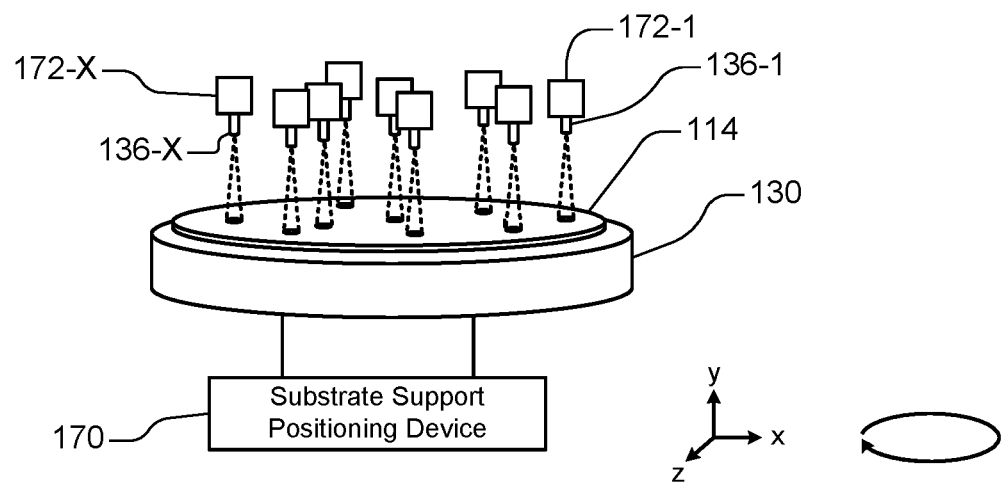
FIG. 1B is a functional block diagram of an example of positioning devices for the optical sensors and/or the substrate support according to the present disclosure.
Figure 1C:
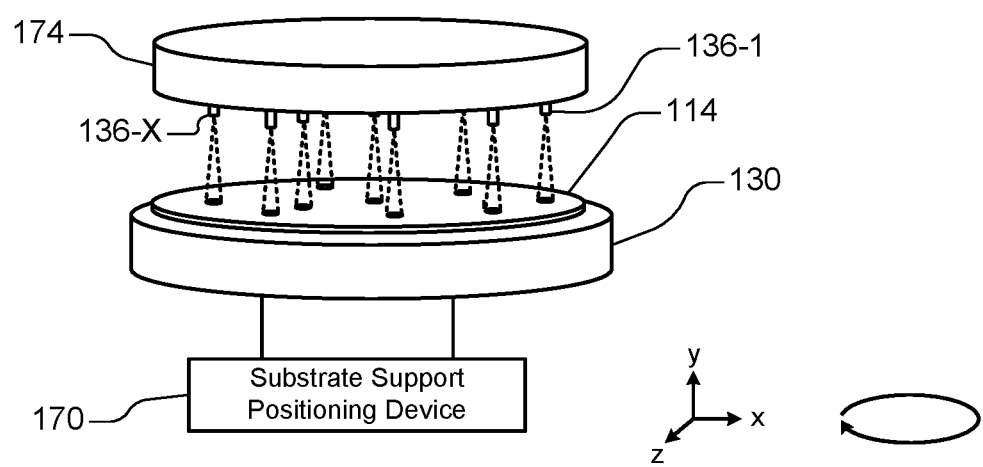
FIG. 1C is a functional block diagram of another example of positioning devices for the optical sensors and/or the substrate support according to the present disclosure.

Referring now to FIGS. 1B and 1C, in some examples a position of the substrate support 130 is adjusted by a substrate positioning device 170. The substrate positioning device 170 adjusts the position of the substrate 114 in x, y or z axis directions and/or rotates the substrate 114. The spectra measurements can be made at one or more static positions and/or one or more dynamic positions.

Alternately or in addition to changing a position of the substrate support, positions of the optical sensors 136-1, . . . . 136-X can be adjusted individually by optical sensor positioning devices 172-1, . . . 172-X (collectively positioning devices 172). The positioning devices 172 can adjust the position of the optical sensors 136 in x, y or z axis directions and/or rotate the optical sensors 136. The spectra measurements can be made at one or more static positions and/or one or more dynamic positions.

In FIG. 1C, alternately or in addition to changing a position of the substrate support, positions of the optical sensors 136-1, ... 136-X can be adjusted collectively by an optical sensor positioning device 174. The optical sensor positioning device 174 adjusts the position of the optical sensors 136 in x, y or z axis directions and/or rotates the optical sensors 136. The spectra measurements can be made at one or more static positions and/or one or more dynamic positions.

Figure 1D:
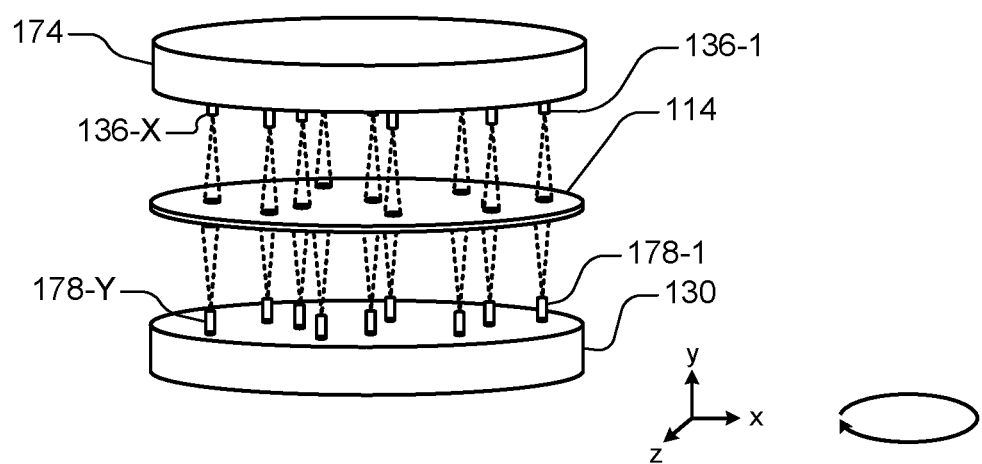
FIG. 1D is a functional block diagram of an example of optical sensors arranged above and below the substrate according to the present disclosure.

In FIG. 1D, optical sensors 178-1, ... 178-Y (collectively optical sensors 178) (where Y is an integer greater than zero) are arranged below the substrate 114 to make measurements on an opposing surface of the substrate 114. Edges of the substrate 114 can be engaged by edge gripping pins similar to those used in spin chucks or using any other suitable device. Alternately, the optical sensors 136 in FIG. 1A can be used for both surfaces of the substrate 114 by inverting the substrate 114 and measuring the substrate 114 again. During processing, film may be deposited on the back side of the substrate. The film deposited on the back side of the wafer does not affect the thickness measurement on the front side. However, the film on the back side of the substrate increases the mass of the substrate and affects the mass change or delta (the mass after the process minus the mass before the process). Measuring the thickness of the substrate on the back side can be used to obtain a more accurate mass delta measurement and to further constrain the spatial thickness distribution model described further below.

In addition to the foregoing, a thickness of the incoming substrate can be measured using the optical sensors 136 and/or 178 prior to film treatment in some examples. The spatial thickness distribution model for the outgoing substrate after film treatment such as deposition or etch can be constrained based on a combination of the mass delta and the incoming substrate thickness variation across the wafer.

Figure 2A:
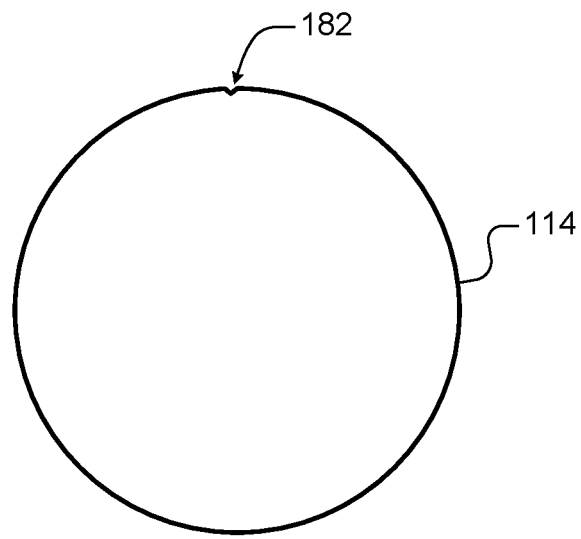
FIG. 2A illustrates a substrate including a notch according to the present disclosure.
Figure 2B:
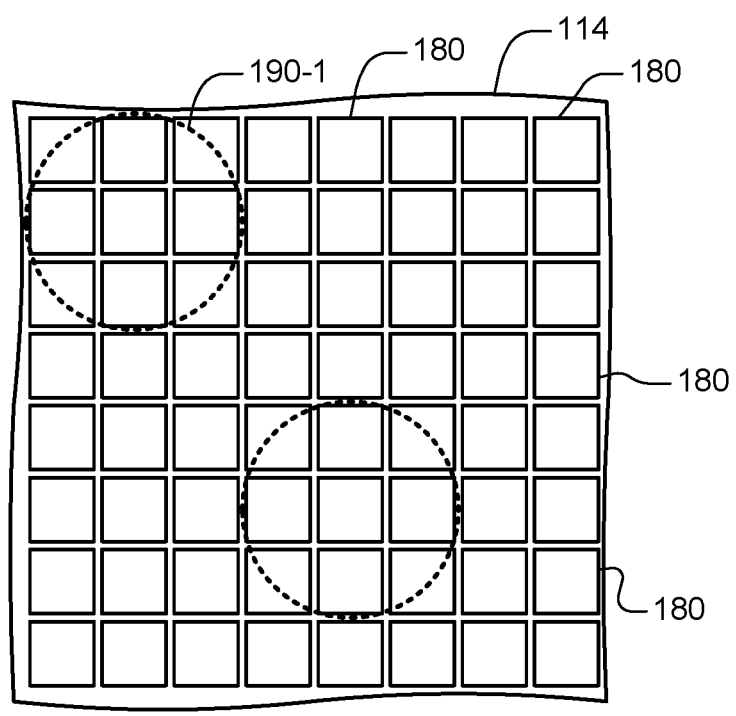
FIG. 2B is a plan view of an example of large optical sensor beam relative to a plurality of dies of a substrate according to the present disclosure.

Referring now to FIG. 2A-2B, the metrology system and the substrate transport and handling system 128 ensure that the substrate is positioned correctly relative to the substrate support. In other words, the substrate is positioned correctly in a plane parallel to the substrate support. In addition, a rotational position of the substrate is correct relative to a reference position or the substrate support. In FIG. 2A, the substrate 114 may include a notch 182 located on a radially outer edge thereof to allow accurate rotational positioning of the substrate 114.

In FIG. 2B, the optical sensors 136 may use a large beam diameter. For example, the substrate 114 may include a plurality of dies 180 arranged adjacent to one another. In some examples, the optical sensors 136 may have a beam diameter that at least partially captures data from a plurality of dies (for example, at least nine adjacent dies 180). Using a larger beam removes the dependence of the measurements on the precise landing spot and allows efficient spatial averaging across several dies.

Figure 3:
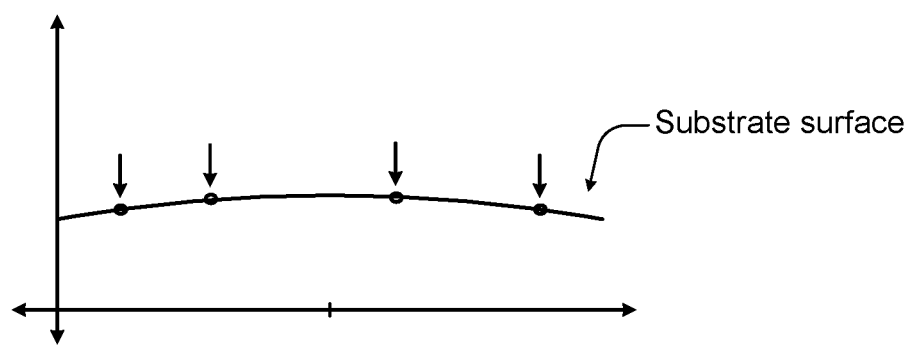
FIG. 3 illustrates an example of a spatial thickness distribution model for a substrate according to the present disclosure.

Referring now to FIG. 3, once the learned model is created, subsequent spectra measurements at the measurement locations are converted to thickness measurements by the learned model. In FIG. 3, a spatial thickness distribution module described below uses the thicknesses at the measurement locations to at least partially define the spatial thickness distribution model. In other words, the thickness measurements are used to create a spatial model of the substrate. The model can be uniform in a radial direction about the center of the substrate or non-uniform (e.g. 3D model). The mass metrology system supplies the mass or mass change to the spatial thickness distribution module. The mass or mass change is used as a constraint or boundary condition when determining the curvature of the top surface using regression analysis or other approach.

Figure 4A:
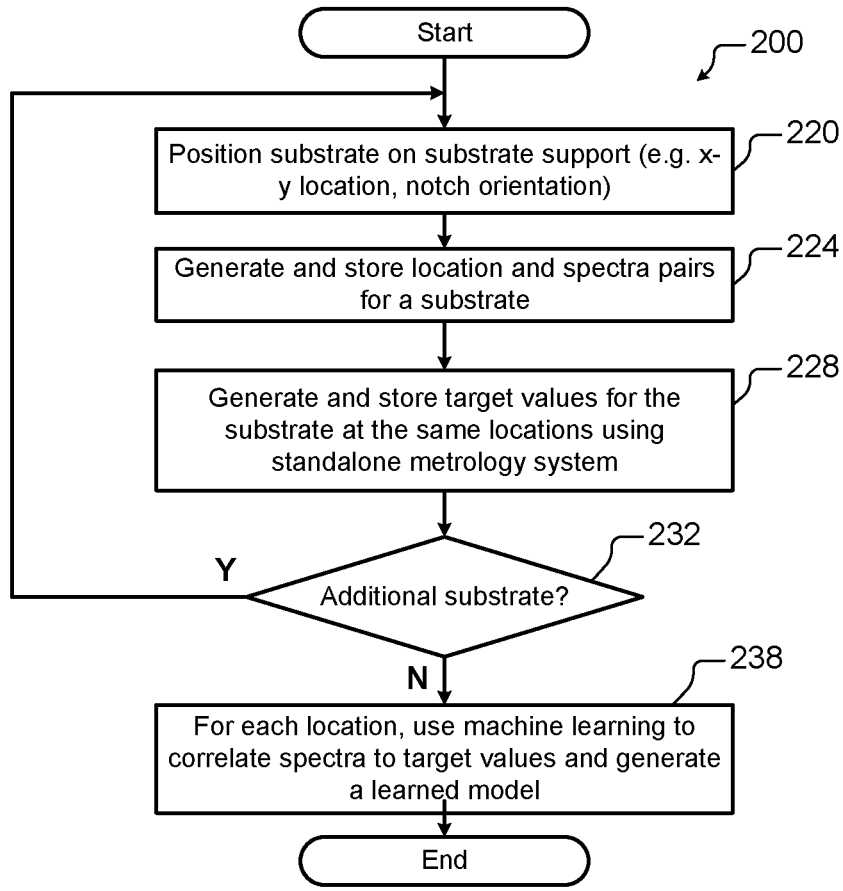
FIGS. 4A and 4B are flowcharts illustrating examples of a method for generating a model relating measured spectra to substrate thickness using target reference values generated by a standalone metrology system according to the present disclosure.
Figure 4B:
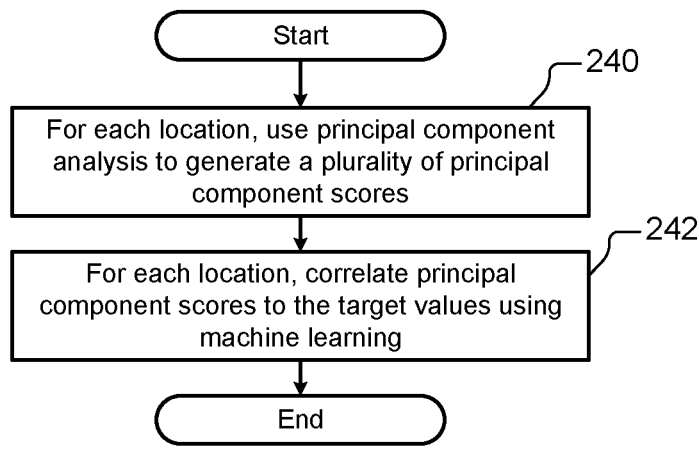

Referring now to FIGS. 4A and 4B, a method 200 for generating a learned model is shown. At 220 in FIG. 4A, a substrate is positioned on the substrate support. In some examples, precise positioning of the substrate is performed (for example, relative to an X-Y location in a plane parallel to the top surface of the substrate support and/or the substrate notch rotational orientation). At 224, the optical metrology system generates and stores location and spectra pairs for each substrate. In some examples, the spectra generated for each location includes multiple wavelengths.

At 228, the standalone metrology system generates and stores target reference values for the substrate at least at the same locations measured by the optical metrology system. The process is repeated for additional substrates as identified at 232. When a sufficient number of substrates samples have been measured, machine learning is used to correlate the measured spectra to the measured target reference values for each location at 238 and to generate the learned model.

In FIG. 4B, the machine learning may include performing principal component analysis (PCA) and determining a plurality of principal component scores as shown at 240. At 242, the plurality of principal component scores are correlated to the target reference values using machine learning.

For example, principal component analysis (PCA) may be used on the spectra generated from the measurement locations on the plurality of sample substrates. Each principal component has a vector that is a function of wavelength. The first principal component corresponds to a first wavelength having the highest variance. The other principal components correspond to other wavelengths having the next highest variances. A subset of all of the principal components can be used. For example, 10 principal components may be used for each spectra.

The spectra is projected into the principal component space by a score for each principal component. After generating a predetermined number of samples from measurement locations of a predetermined number of substrates, a first matrix can be generated that includes the principal component scores, a second matrix can be generated with the principal component vectors and a third matrix can be generated including the corresponding target values. A learning vector or model can be generated from these matrices using any suitable approach such as a neural network, linear regression, a non-linear model, etc. The learned model is used to convert subsequent spectra measurements made during production into thickness values and a spatial thickness distribution model (constrained by the mass measurement from the mass metrology station) for each substrate without the need for target reference values during production. The combination of the mass measurement and the spatial thickness distribution model can be used to assess operation of the process and/or to make adjustments to process parameters used during production of subsequent substrates.

Figure 5:
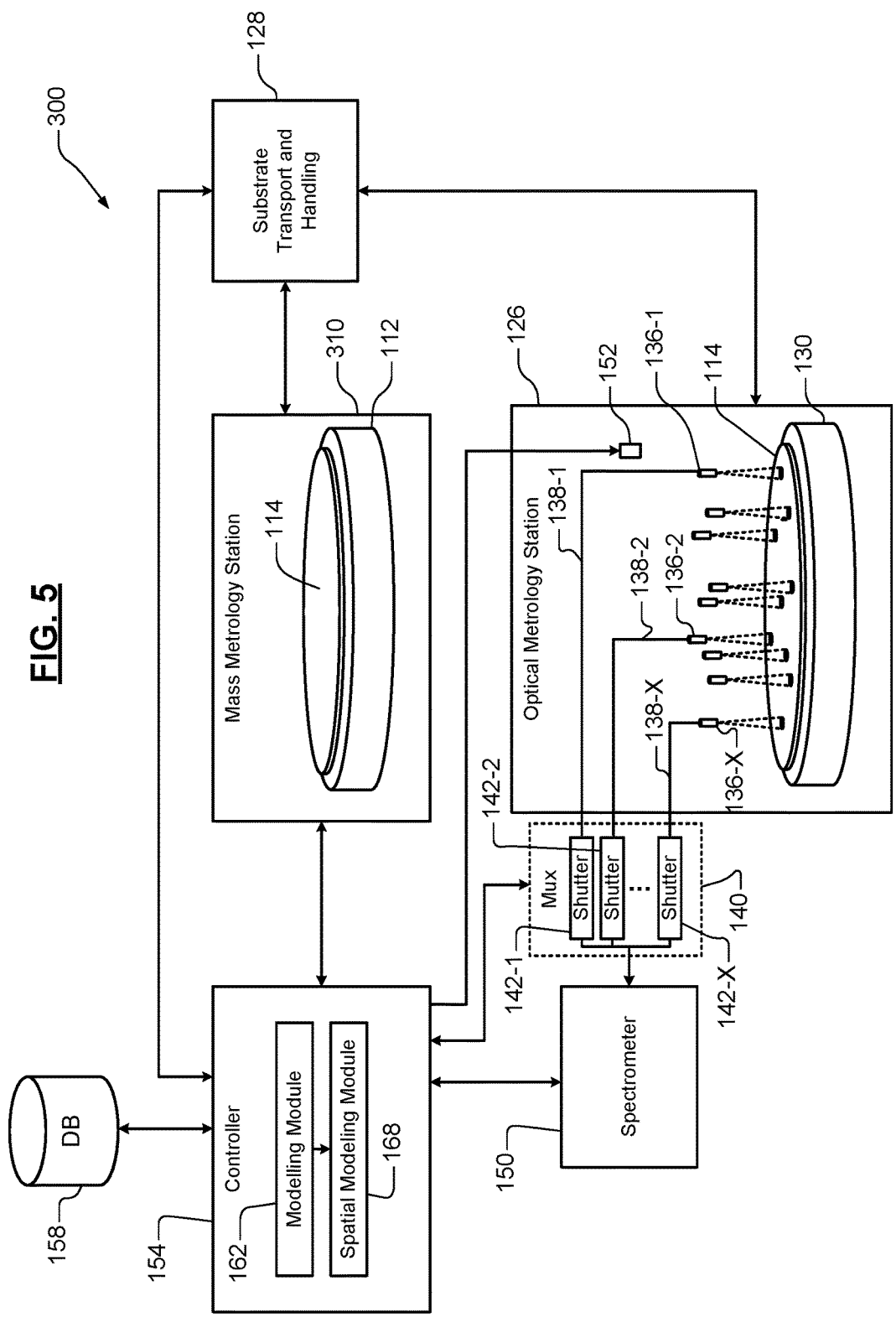
FIG. 5 is a functional block diagram of an example of a metrology system according to the present disclosure configured for production according to the present disclosure.

Referring now to FIG. 5, a metrology system 300 is shown in a production configuration. The standalone metrology system 110 is replaced by a less expensive mass metrology station 310 and the standalone metrology system 110 is no longer used, which significantly reduces cost. In some examples, the mass metrology station 310 compensates for one or more parameters such as tilt, temperature, humidity, pressure, altitude, gravity and/or buoyancy. In some examples, the mass metrology station 310 includes a load cell with internal gravity calibration. Suitable mass metrology stations are available from Metryx, a Lam Research Company. For example, suitable mass metrology stations providing gravity, temperature and/or buoyancy compensation are shown and described in commonly-owned U.S. Pat. No. 9,228,886, which is entitled "Semiconductor Wafer Weight Metrology Apparatus" and which is hereby incorporated by reference in its entirety.

The learned model generated during the learned model training mode is used in conjunction with mass measurements output by the mass metrology station 310 to determine various parameters such as the thickness of a layer, the surface spatial model or other parameters as will be described further below. While the mass metrology station 310 and the optical metrology station 126 are shown as separate stations, the mass metrology station 310 and the optical metrology station 126 can be co-located in the same station. In other words, the optical sensors may be arranged above the load cell in the same station.

During the production mode, the optical metrology system generates the spectra as described above. The spectra are fed to the learned model, which generates physical parameters such as thickness data or other substrate physical parameters for the plurality of measurement locations of the substrate. The mass metrology station generates mass or mass change data for each of the substrates. The mass change data can be generated using pre- and post-measurements of the substrates.

The thickness data for the measured locations is provided as inputs to a spatial thickness distribution module, which determines a surface model or curvature of the top surface of the substrate. The mass is used by the spatial thickness distribution model as a constraint or boundary condition for regression analysis. The resulting spatial thickness distribution model of the substrate surface is used to determine the thickness of the top surface of the substrate at locations other than the measurement locations. The thickness can be used in conjunction with the mass or mass change to diagnose system performance and/or to make changes to process parameters for production of subsequent substrates.

Figure 6:
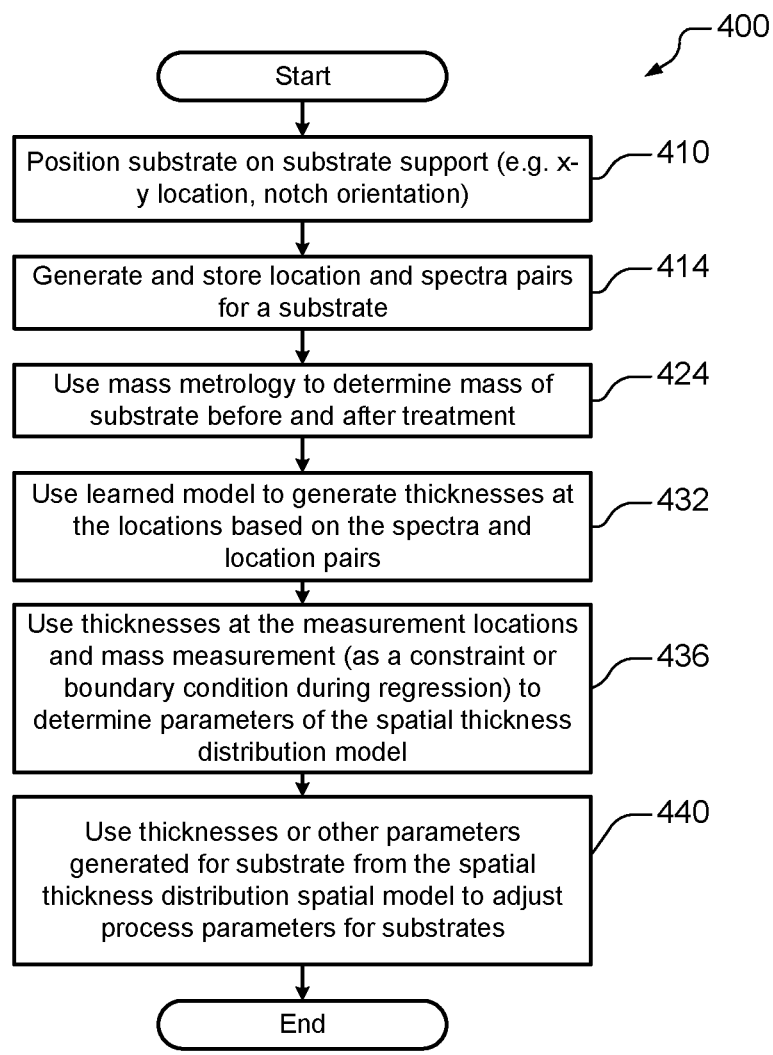
FIGS. 6 and 7 are flowcharts illustrating examples of methods for using the learned model, the spectra generated by the optical metrology station and the mass generated by the mass metrology station to determine substrate parameters and/or to adjust process parameters according to the present disclosure.

Referring now to FIG. 6, a method 400 is shown for determining physical parameters of the substrate using the learned model, the spectra generated by the optical metrology station and the mass generated by the mass metrology station. At 410, a substrate is positioned on a substrate support in the optical metrology station. At 414, the optical metrology system generates and stores location and spectra pairs for a substrate. At 424, the mass metrology system is used to determine the mass or mass change of the substrate before and after a substrate treatment.

At 432, the learned model generated during the training mode is used during production to convert the spectra at the measurement locations to thickness values or other parameters. At 436, the thicknesses at the measurement locations are used by the spatial thickness distribution module to determine parameters of the spatial thickness distribution model of the top surface of the substrate. The mass or mass change measurement is used as a constraint or boundary condition during regression analysis. At 440, the thickness, spatial thickness distribution model or other parameters are used to adjust process parameters.

Figure 7:
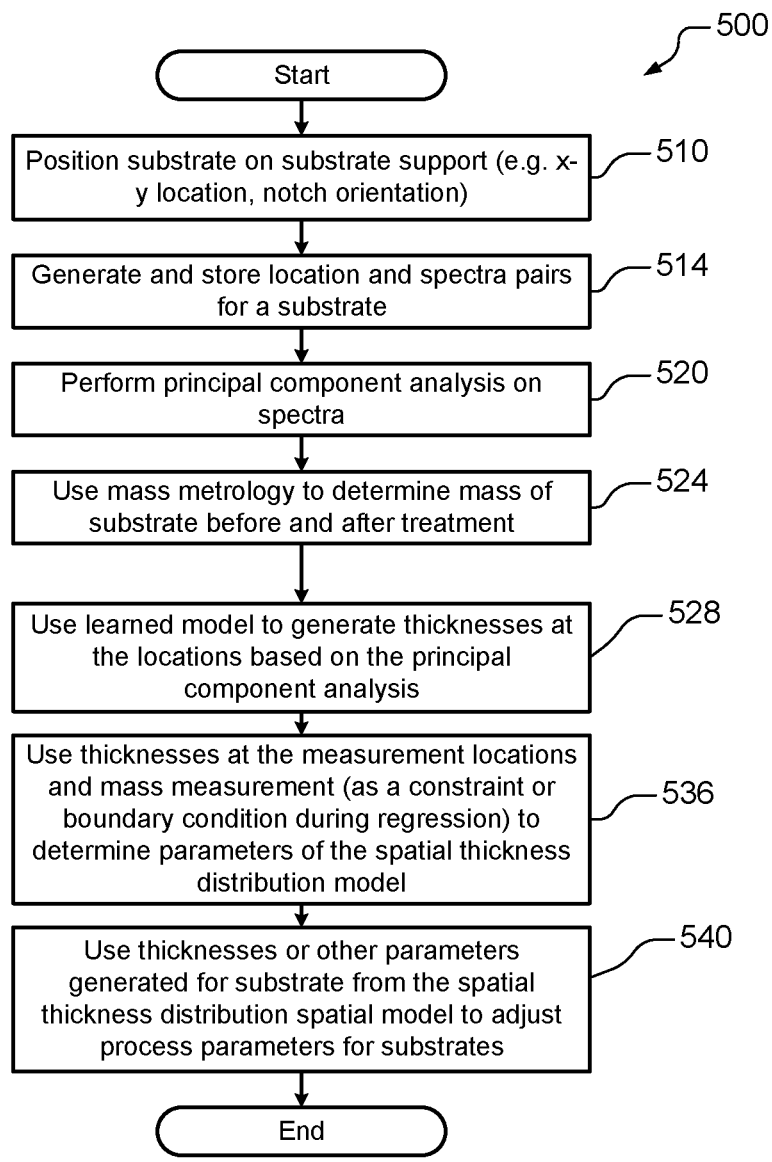

Referring now to FIG. 7, a method 500 is shown for determining physical parameters of the substrate using the learned model, the spectra generated by the optical metrology station and the mass generated by the mass metrology station. At 510, a substrate is positioned on a substrate support in the optical metrology station. At 514, the optical metrology system generates and stores location and spectra pairs for a substrate. At 520, principal component analysis is performed on the spectra. At 524, the mass metrology system is used to determine the mass or mass change of the substrate before and after a substrate treatment.

At 528, the learned model generated during the training mode is used during production to convert the principal component analysis to thickness values or other parameters. At 536, the thicknesses at the measurement locations are used by the spatial thickness distribution module to determine parameters of the spatial thickness distribution model of the top surface of the substrate. The mass or mass change measurement is used as a constraint or boundary condition during regression analysis. At 540, the thickness, spatial thickness distribution model or other parameters are used to adjust process parameters.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A metrology system for substrate processing, comprising:
   an optical metrology station including:
      a plurality of optical sensors to measure spectra from a plurality of measurement locations on a substrate;
      a plurality of fiber cables connected to the plurality of optical sensors; and
      a spectrometer selectively connected to the plurality of fiber cables;
   a mass metrology station to measure at least one of a mass or mass change of the substrate; and
   a controller including;
      a modelling module to generate thickness values at the plurality of measurement locations based on the spectra from the plurality of measurement locations and a learned model; and
      a spatial modelling module to generate a spatial thickness distribution model for the substrate based on the thickness values at the plurality of measurement locations from the modelling module and the at least one of the mass or the mass change from the mass metrology station, wherein the mass is used by the spatial thickness distribution model as a constraint.

2. The metrology system of claim 1, further comprising a plurality of shutters connected to the plurality of fiber cables, respectively, wherein the plurality of shutters are configured to sequentially output spectra from one of the plurality of fiber cables at a time to the spectrometer.

3. The metrology system of claim 1, wherein the learned model is generated using machine learning.

4. The metrology system of claim 3, wherein the machine learning includes a supervised learning model selected from a group consisting of linear models, support vector machine models, decision tree models, random forest models and Gaussian models.

5. The metrology system of claim 1, wherein the learned model is based on a first-principle model.

6. The metrology system of claim 5, wherein the first-principle model is selected from a group consisting of Fresnel multi-beam interference, rigorous coupled-wave analysis (RCM); and finite-difference time-domain (FDTD).

7. The metrology system of claim 1 wherein the substrate includes a plurality of dies and wherein the optical sensors have a beam diameter that generates samples from portions of a plurality of contiguous dies.

8. The metrology system of claim 1, wherein the learned model is generated by correlating the spectra from a plurality of measurement locations of a plurality of sample substrates with at least one of thickness data, critical dimension data, depth data and material density data generated by a standalone metrology station for the plurality of measurement locations for the plurality of sample substrates.

9. The metrology system of claim 1 wherein the learned model is generated by performing principal component analysis.

10. The metrology system of claim 1, wherein the spatial modelling module uses the at least one of the mass or the mass change as at least one of a constraint or a boundary condition during regression analysis.

11. The metrology system of claim 1, wherein the learned model is generated using an autoencoder.

12. The metrology system of claim 1, further comprising an optical sensor positioner to adjust a position of at least one of the optical sensors.

13. The metrology system of claim 1, further comprising a substrate support positioner to adjust a position of a substrate support.

14. The metrology system of claim 1, wherein the plurality of optical sensors measure spectra from opposing surfaces of the substrate.

15. The metrology system of claim 1, wherein the spatial modelling module generates the spatial thickness distribution model for the substrate further based a thickness of the substrate prior to film treatment.

16. A method for providing metrology for substrate processing, comprising:
providing an optical metrology station including a plurality of optical sensors to measure spectra from a plurality of measurement locations on a substrate;
measuring at least one of a mass or mass change of the substrate;
generating thickness values at the plurality of measurement locations of the substrate based on the spectra from the plurality of measurement locations and a learned model; and
generating a spatial thickness distribution model for the substrate based on the thickness values at the plurality of measurement locations and the at least one of the mass or the mass change, wherein the mass is used by the spatial thickness distribution model as a constraint.

17. The method of claim 16, wherein the learned model is generated using machine learning.

18. The method of claim 1 wherein the machine learning includes a supervised learning model selected from a group consisting of linear models, support vector machine models, decision tree models, random forest models and Gaussian models.

19. The method of claim 16, wherein the learned model is based on a first-principle model.

20. The method of claim 19, wherein the first-principle model is selected from a group consisting of Fresnel multi-beam interference, rigorous coupled-wave analysis (RCWA), or finite-difference time-domain (FDTD).

21. The method of claim 16, wherein the substrate includes a plurality of dies and wherein the optical sensors have a beam diameter sufficient to generate samples from portions of a plurality of contiguous dies.

22. The method of claim 16, further comprising generating the learned model by correlating the spectra from a plurality of measurement locations of a plurality of sample substrates with at least one of thickness data, critical dimension data, depth data and material density data generated by a standalone metrology station for the plurality of measurement locations for the plurality of sample substrates.

23. The method of claim 16, further comprising generating the learned model by performing principal component analysis.

24. The method of claim 16, further co sing using the at least one of the mass or the mass change as at least one of a constraint or a boundary condition during regression analysis for the spatial thickness distribution model.

25. The method of claim 16, further comprising generating the learned model using autoencoding.

26. The method of claim 16, further comprising adjusting a position of at least one of the optical sensors during measurement of the spectra for the substrate.

27. The method of claim 16, further comprising adjusting a position of a substrate support supporting the substrate during measurement of the spectra for the substrate.

28. The method of claim 16, wherein generating spectra from opposing surfaces of the substrate.

29. The method of claim 16, further comprising:
generating a thickness of the substrate prior to film treatment; and
generating the spatial thickness distribution model for the substrate further based the thickness of the substrate prior to film treatment.

* * * * *